(12) United States Patent
Tsao

(10) Patent No.: US 9,111,659 B2
(45) Date of Patent: Aug. 18, 2015

(54) ELECTRODES OF SOLAR CELL FORMED BY ACTIVE SOLDER AND METHOD THEREFOR

(75) Inventor: Lung-chuan Tsao, Pingtung (TW)

(73) Assignee: NATIONAL PINGTUNG UNIVERSITY OF SCIENCE & TECHNOLOGY, Pingtung County (TW)

(*) Notice: Subject to any disclaimer, the term of this patent is extended or adjusted under 35 U.S.C. 154(b) by 427 days.

(21) Appl. No.: 13/538,097

(22) Filed: Jun. 29, 2012

(65) Prior Publication Data
US 2013/0000718 A1    Jan. 3, 2013

(30) Foreign Application Priority Data
Jun. 29, 2011    (TW) .............................. 100122901 A

(51) Int. Cl.
B23K 1/00    (2006.01)
H01L 31/0224  (2006.01)
H01B 1/02    (2006.01)
B23K 3/06    (2006.01)
H05K 3/34    (2006.01)

(52) U.S. Cl.
CPC .......... *H01B 1/02* (2013.01); *H01L 31/022425* (2013.01); *B23K 3/0638* (2013.01); *B23K 2201/40* (2013.01); *H05K 3/3468* (2013.01); *Y02E 10/50* (2013.01)

(58) Field of Classification Search
CPC .............................................. H01L 31/022425

USPC ...................... 136/256; 438/98; 257/E31.124
See application file for complete search history.

(56) References Cited

U.S. PATENT DOCUMENTS

| 4,612,698 A * | 9/1986 | Gonsiorawski et al. ......... 438/72 |
| 6,047,876 A * | 4/2000 | Smith .......................... 228/111.5 |
| 2005/0211752 A1* | 9/2005 | Hurley et al. .................. 228/245 |
| 2010/0075261 A1* | 3/2010 | Clevenger et al. ............. 430/314 |
| 2011/0204126 A1* | 8/2011 | Von Campe et al. ........... 228/262 |
| 2011/0272453 A1* | 11/2011 | Von Campe et al. ........... 228/205 |
| 2014/0219711 A1* | 8/2014 | Pandher et al. ................ 403/272 |

FOREIGN PATENT DOCUMENTS

| JP | 2001127317 | 5/2001 |
| JP | 2004146521 | 5/2004 |
| TW | I339400 | 3/2011 |

* cited by examiner

*Primary Examiner* — Su C Kim
*Assistant Examiner* — Regan J Rundio
(74) *Attorney, Agent, or Firm* — Muncy, Geissler, Olds & Lowe, P.C.

(57) ABSTRACT

Electrodes of a solar cell formed by an active solder and a method therefor are provided. The method includes steps of: providing a solar cell substrate; providing an active solder having at least one type of soldering alloy mixed with 6 wt % or less of at least one type of active component and 0.01-2.0 wt % of at least one type of rare earth element (Re); firstly melting the active solder at a temperature lower than 450° C.; then applying the molten active solder on the solar cell substrate (or firstly applying and then melting); and cooling to solidify the active solder, so as to form an electrode pattern.

5 Claims, 5 Drawing Sheets

ELECTRODES OF SOLAR CELL FORMED BY ACTIVE SOLDER AND METHOD THEREFOR

FIELD OF THE INVENTION

The present invention relates to an electrode of a solar cell formed and a method therefor, and more particularly to an electrode of a solar cell formed by an active solder and a method therefor.

BACKGROUND OF THE INVENTION

Recently, because fossil fuel is gradually depleted, the development of various alternative energy resources (i.e. solar cell, fuel cell, wind power) gets more and more attention, particularly the solar power generation.

Referring to FIG. 1, a cross-sectional view of a conventional solar cell element is illustrated, wherein when forming the conventional solar cell element, firstly providing a p-type silicon semiconductor substrate 11 which is etched to form the roughness of surface. Then, a light receiving side of the p-type silicon semiconductor substrate 11 is formed with an n-type diffusion layer 12 of reverse conductive type by heat diffusion using phosphorus or analogues, so as to form a p-n junction. Subsequently, an anti-reflection layer 13 and a front electrode 14 are formed on the n-type diffusion layer 12, wherein a silicon nitride layer is formed on the n-type diffusion layer 12 to be the anti-reflection layer 13 by plasma enhanced chemical vapor deposition (PECVD) thereof. Furthermore, the anti-reflection layer 13 is coated with silver conductive pastes by screen printing, and then processes of curing, drying and high-temperature sintering are carried out to form the front electrode 14. In the process of high-temperature sintering, the silver conductive paste for forming the front electrode 14 can be sintered and penetrate the anti-reflection layer 13 until the silver conductive paste is electrically in contact with the n-type diffusion layer 12.

Furthermore, the back side of the p-type silicon semiconductor substrate 11 uses aluminum conductive paste to form a back electrode layer 15 of aluminum by printing. After, the processes of curing and drying are applied, and the process of high-temperature sintering is carried out, as described above. In the process of high-temperature sintering, the aluminum conductive paste is dried and converted into the back electrode layer 15 of aluminum. Simultaneously, the aluminum atoms are spread into the p-type silicon semiconductor material 11, so that there is a p+ layer 16 having a high concentration of aluminum dopant and formed between the back electrode layer 15 and p-type semiconductor material 11, which is usually called a back surface field (BSF) layer for improving the optical conversion efficiency of solar cell. Because the back electrode layer 15 of aluminum is difficult to weld, the back electrode layer 15 is printed with an aluminum-silver conductive paste thereon by the screen printing, and then sintered to form a conductive wire 17, so that a plurality of solar cells can be serially connected to form a module.

However, the conventional solar cell elements still have the following problems: for example, the front electrode 14, the back electrode layer 15 and the conductive wire 17 are made of silver, aluminum or aluminum-silver conductive pastes. And, the material cost of these conductive pastes is high, and is about 10% of the total cost of the module. Furthermore, the conductive pastes have a predetermined ratio of metal powders, glass powders and organic agent, for example, Japan Kokai Publication No. 2001-127317 and 2004-146521 and Taiwan Pat. No. 1339400 issued to DuPond, wherein the conductive pastes contain glass microparticles that decrease the conductivity and solderability; additionally, the conductive pastes contain the organic solvent therein. Therefore, after sintering, the solar cell chips will be contaminated and thus must be additionally cleaned.

In addition, the electrodes or conductive wires made by the conductive pastes must pass through the high-temperature sintering at 450-850° C. But, at the high temperature, the materials of others material layers may be deteriorated or malfunctioned, and even the yield of manufacturing the cells is seriously affected. Simultaneously, during the sintering of the front electrode 14, the conditions must be controlled, so as to ensure that the conductive pastes of the front electrode 14 completely penetrate through the anti-reflection layer 13 and are electrically in contact with the n-type diffusion layer 12. If the front electrode 14 is not actually in contact with the n-type diffusion layer 12, the manufacture yield of the cells will be dramatically reduced. As described above, according to the precise control requirement of the conditions of the high-temperature sintering, the process of high-temperature sintering needs to consume much time and have more complication, so as to affect the throughput per unit time when generating the cells.

As a result, it is necessary to provide a method for manufacturing electrodes of a solar cell formed by an active solder to solve the problems existing in the conventional technologies, as described above.

SUMMARY OF THE INVENTION

A primary object of the present invention is to provide an electrode of a solar cell formed by an active solder and a method therefor, which use the active solder of low cost to form the front or back electrode pattern, wherein the active solder only needs lower temperature for being soldered on the solar cell substrate to form the electrode pattern. Therefore, the present invention can reduce the manufacture cost, simplify and enhance the manufacture processes of electrodes, and improve the electric effect thereof.

A second object of the present invention is to provide an electrode of a solar cell formed by an active solder and a method therefor, which a notch is pre-formed on the anti-reflection of the solar cell substrate for being filled with the active solder to form an electrode pattern, so that it is unnecessary for the electrode pattern to penetrate through the anti-reflection layer by high-temperature sintering. Therefore, it is advantageous to ensure the reliability of electric connection between the electrode pattern and the solar cell substrate, and increase the manufacture yield of the electrodes. Furthermore, the electrical energy of the photoelectric effect can be effectively transmitted to the electrode for increasing the conversion efficiency of solar cell chips.

Another object of the present invention is to provide an electrode of a solar cell formed by an active solder and a method therefor, wherein the electrode pattern made of the active solder can selectively form a protective layer by electroless plating or electroplating, so as to increase the thickness of the electrode pattern and the connection property, the conductivity and the anti-rust effects of the electrode pattern connected to the external conductive wire.

To achieve the above object, the present invention is to provide a method for manufacturing an electrode of a solar cell formed by an active solder and a method therefor, which comprises steps of:

providing a solar cell substrate;

providing an active solder having at least one type of soldering alloy mixed with 6 wt % or less of at least one type of active component and 0.01-2.0 wt % of at least one type of rare earth element (Re);

firstly melting the active solder at a temperature lower than 450° C.;

then applying the molten active solder on the solar cell substrate; and cooling to solidify the active solder, so as to form an electrode pattern.

In one embodiment of the present invention, the step of applying the molten active solder on the solar cell substrate, using a screen to apply the molten active solder on the solar cell substrate, wherein the screen has a notch and the shape of the notch corresponds to the shape of the electrode pattern for melting the molten active solder on the solar cell substrate.

Furthermore, the present invention is to provide another method for manufacturing an electrode of a solar cell formed by an active solder and a method therefor, which comprises steps of:

providing a solar cell substrate;

providing an active solder having at least one type of soldering alloy mixed with 6 wt % or less of at least one type of active component and 0.01-2.0 wt % of at least one type of rare earth element;

firstly applying the molten active solder on the solar cell substrate;

then melting the active solder at a temperature lower than 450° C.; and cooling to solidify the active solder, so as to form an electrode pattern.

In one embodiment of the present invention, the step of firstly applying the molten active solder on the solar cell substrate, firstly using a screen to print an active solder paste onto the solar cell substrate; wherein the screen has a notch and the shape of the notch corresponds to the shape of the electrode pattern.

In one embodiment of the present invention, in the step of applying the molten active solder on the solar cell substrate, selecting to use a solder pin to apply the active solder on the solar cell substrate by a linear coating manner, so as to form the shape of the electrode pattern.

In one embodiment of the present invention, after the step of forming the electrode pattern, further comprising: selecting to form a protective layer by electroless plating or electroplating, so as to increase the thickness of the electrode pattern.

In one embodiment of the present invention, in the step of forming the electrode pattern, connecting a conductive metal wire on an upper side of the electrode pattern.

In one embodiment of the present invention, the soldering alloy is selected from tin-based alloy, bismuth-based alloy or indium-based alloy.

In one embodiment of the present invention, the tin-based alloy, bismuth-based alloy or indium-based alloy is mixed with at least one type of the active component which is selected from 4 wt % or less of titanium (Ti), vanadium (V), magnesium (Mg), lithium (Li), zirconium (Zr), hafnium (Hf) or the mixture thereof.

In one embodiment of the present invention, the rare earth element is selected from scandium (Sc), yttrium (Y) or lanthanide element, and the lanthanide element is selected from lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb) or lutetium (Lu).

In one embodiment of the present invention, the solar cell substrate having a front surface and an anti-reflection layer formed on the front surface; and the anti-reflection layer is formed with a notch in which the active solder is filled, so as to form the electrode pattern.

In one embodiment of the present invention, the solar cell substrate has a back surface, and the electrode pattern is formed on the rear surface by the active solder.

In one embodiment of the present invention, metal used by the electroless plating or electroplating is Cu, Ag, Ni, Au or any composite layer thereof.

In one embodiment of the present invention, the thickness of the electrode pattern is between 0.1 micrometer (μm) and 0.3 μm.

Furthermore, the present invention is to provide an electrode of a solar cell formed by an active solder, comprising:

an electrode pattern selectively formed on one or both of a front side and a back side of a solar cell substrate;

wherein the electrode pattern is formed by coating an active solder; and the active solder has at least one type of soldering alloy mixed with 6 wt % or less of at least one type of active component and 0.01-2.0 wt % of at least one type of rare earth element (Re).

DETAILED DESCRIPTION OF THE PREFERRED EMBODIMENTS

The structure and the technical means adopted by the present invention to achieve the above and other objects can be best understood by referring to the following detailed description of the preferred embodiments and the accompanying drawings. Furthermore, directional terms described by the present invention, such as upper, lower, front, back, left, right, inner, outer, side, longitudinal/vertical, transverse/horizontal, and etc., are only directions by referring to the accompanying drawings, and thus the used directional terms are used to describe and understand the present invention, but the present invention is not limited thereto.

Referring to Figs. from 2A to 2G, schematic views of a method for manufacturing electrodes of a solar cell formed by an active solder according to a first embodiment of the present invention are illustrated, wherein the method comprises steps of: providing a solar cell substrate 2; providing an active solder 3, wherein having at least one type of soldering alloy mixed with 6 wt % or less of at least one type of active component and 0.01-2.0 wt % of at least one type of rare earth element (Re); firstly melting the active solder 3 at a temperature lower than 450° C.; then applying the molten active solder 3 on the solar cell substrate 2; and cooling to solidify the active solder 3, so as to form an electrode pattern 31.

Figure 2A:
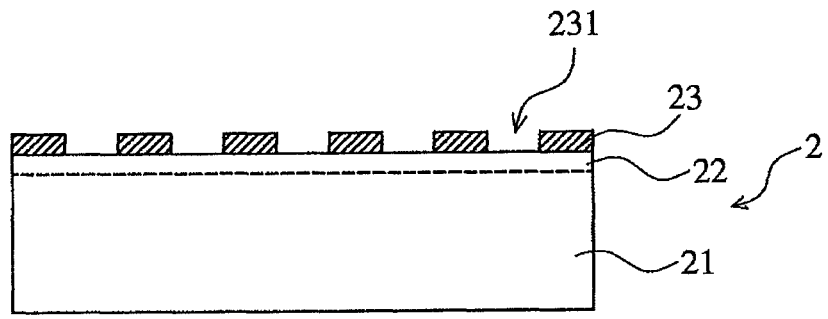
FIGS. 2A, 2B, 2C, 2D, 2E and 2F are schematic views of a method for manufacturing electrodes of a solar cell formed by an active solder according to a first embodiment of the present invention.

Referring to FIG. 2A, the method for manufacturing electrodes of a solar cell formed by an active solder according to the first embodiment of the present invention is firstly to provide a solar cell substrate 2. In the step, the solar cell substrate 2 can be selected from a silicon solar cell (such as poly-crystalline silicon, mono-crystalline silicon or non-crystalline silicon), a compound solar cell (such as GaAs of III-V group element, CdTe and CdS of II-VI group elements or CuInSe$_2$ of multi-compounds) or a chip type or a film type of an organic solar cell. For example, the solar cell substrate 2 can selectively have a p-type semiconductor material 21, but not limited thereto.

Referring to FIG. 2A again, in one embodiment of the present invention, when the solar cell substrate 2 has the p-type semiconductor material 21, the solar cell substrate 2 can pre-form a n-type diffusion layer 22, and then an anti-reflection layer 23 is formed on the n-type diffusion layer 22. The thickness of the anti-reflection layer 23 is about 700-900 Å, wherein the anti-reflection layer 23 can pre-form at least one notch 231 by coating photoresist, photomask exposure, development and etching of the conventional techniques; alternatively, the anti-reflection layer 23 can be removed to form at least one notch 231 by laser. The shape of the notch 231 corresponds to a predetermined shape of the electrode pattern 31 on the front side. The notch 231 can be square, V-shaped or others shapes, but not limited thereto.

Figure 2B:
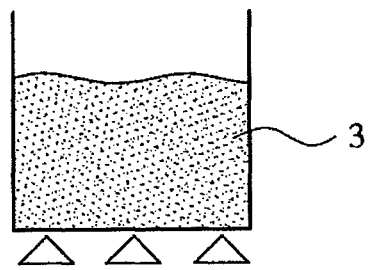

Referring to FIG. 2B, the method for manufacturing electrodes of a solar cell formed by an active solder according to the first embodiment of the present invention is then to provide an active solder having at least one type of soldering alloy mixed with 6 wt % or less of at least one type of active component and 0.01-2.0 wt % of at least one type of rare earth element (Re). In the step, the active solder 3 can be a linear solid soldering rod, soldering powders or a soldering paste. The soldering alloy is selected from tin-based alloy, indium-based alloy, bismuth-based alloy, others soldering alloys or the mixture thereof. The tin-based alloy, bismuth-based alloy or indium-based alloy is further mixed with 6 wt % or less of at least one type of the active component, such as 0.1-6.0 wt %, 0.1-5.0 wt % or 0.1-4.0 wt % of titanium (Ti), vanadium (V), magnesium (Mg), lithium (Li), zirconium (Zr), hafnium (Hf) or the mixture thereof.

Moreover, the tin-based alloy, bismuth-based alloy or indium-based alloy also can be mixed with 0.01-2.0 wt %, 0.01-1.0 wt % or 0.01-0.5 wt % of at least one type of rare earth element (Re). For example, the rare earth element is selected from scandium (Sc), yttrium (Y) or lanthanide element, wherein the lanthanide element is selected from lanthanum (La), cerium (Ce), praseodymium (Pr), neodymium (Nd), promethium (Pm), samarium (Sm), europium(Eu), gadolinium (Gd), terbium (Tb), dysprosium (Dy), holmium (Ho), erbium (Er), thulium (Tm), ytterbium (Yb) or lutetium (Lu). In the utilization of the industry, the rare earth element generally exists in a status of the mixture, for example, mixed with lanthanum (La), cerium (Ce), praseodymium (Pr), neodymium (Nd) or samarium (Sm) and the trace amounts of iron (Fe), phosphorous (P), sulfur (S) or silicon (Si).

Referring to FIG. 2B again, the method for manufacturing electrodes of a solar cell formed by an active solder according to the first embodiment of the present invention is then to firstly melting the active solder 3 at a temperature lower than 450° C. In the step, according to the ratio of actual components of the active solder 3, the range of a predetermined melting temperature of the active solder 3 is maintained to be at a lower heating temperature less than 450° C., such as between 100° C. and 450° C., between 150° C. and 400° C. or between 200° C. and 350° C., but not limited thereto. Before coating the active solder 3 on the solar cell substrate 2, the active solder 3 is preheated to melt for being a status of melting. During heating, the active solder 3 is stirred for completely mixing the components. The step of FIG. 2B is adjusted according to the manufacturing process if necessary, for example, the present process can also be removed, but replaced by using a scraper 5 having a heating device (not shown) to directly melt the active solder 3.

Figure 2C:
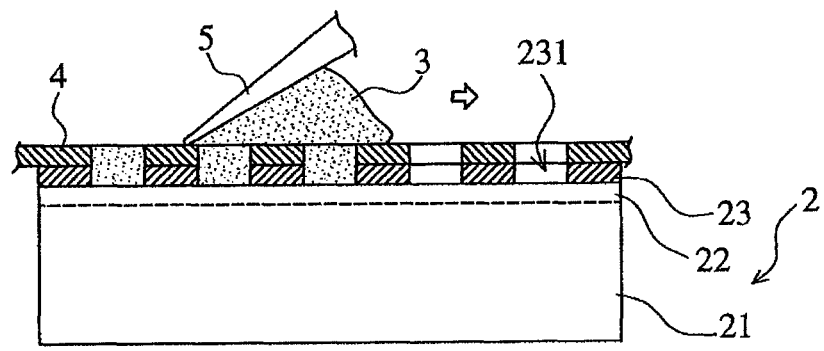

Referring to FIG. 2C, the method for manufacturing electrodes of a solar cell formed by an active solder according to the first embodiment of the present invention is then to apply the molten active solder 3 on the solar cell substrate 2. In the step, the molten active solder 3 is applied on the front side of p-type silicon semiconductor substrate 21 of the solar cell substrate 2. In detail, the active solder 3 is melt by using a screen 4 and a scraper 5 having a heating device (not shown), and is printed and coated on the front side of the solar cell substrate 2, wherein the screen 4 has a notch (not shown) with a shape corresponding to the predetermined shape of the electrode pattern 31, so that the active solder 3 can be filled into the notch of the screen 4 and at least one notch 231 of the anti-reflection layer 23 by using the scraper 5, and thus the active solder 3 is welded and connected to the front side of n-type diffusion layer 22 of the solar cell substrate 2.

Furthermore, when using the scraper 5 having the heating device, the present invention preferably selects to apply ultrasonic waves to the active solder 3 through the scraper 5 for activating a reactive interface between the active solder 3 and the front side (a surface of n-type diffusion layer 22) of the solar cell substrate 2. The frequency of the ultrasonic waves and the treating time thereof are adjusted based on parameters of the type of the active solder 3 and the actual coating thickness thereof, but not limited thereto. When applying the energy of the ultrasonic waves to the active solder 3, the wave energy of the ultrasonic waves is transmitted into the active solder 3 for breaking an anti-oxidation surface film of the active solder 3 by agitation of ultrasonic waves, so as to expose the metal solder and the active component of the active solder 3. Thus, the active component of the molten active solder 3 is promoted to react with the front side of the solar cell substrate 2, in order to form a reactive interface. Additionally, the ultrasonic waves also provide high hardness particles of inter-metallic compounds of the active solder 3 for applying the abrasion and wiping cleaning to a solid surface of the front side of the solar cell substrate 2. Thus, it is advantageous to remove soil particles and passivation layer from the surface of the front side of the solar cell substrate 2. Moreover, the ultrasonic waves also provide additional kinetic energy to the active solder 3 for permeating into pores or other dead corners on the front side of the solar cell substrate 2. After the active solder 3 is cooled to solidify, the active solder 3 will be directly and rigidly connected to the solid surface of the cleaned solar cell substrate 2 for decreasing the used amount of the soldering flux. Besides, during the ultrasonic waves assists the active connection of the active solder 3, the active solder 3 forming the electrode pattern 31 on the front side can pass through the anti-reflection layer 23 for being connected to the n-type diffusion layer 22. The method is generally called "joining through" for increasing the electric connection property.

Figure 2D:
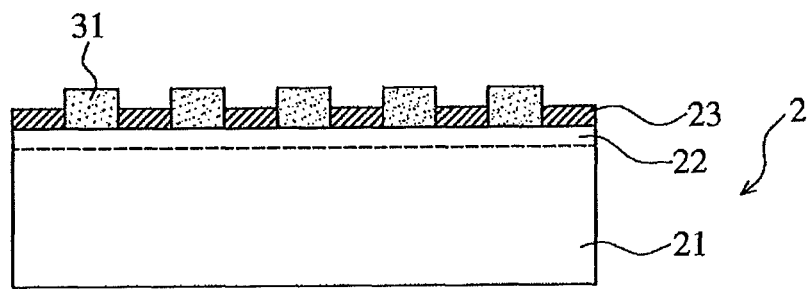

Referring to FIG. 2D, the method for manufacturing electrodes of a solar cell formed by an active solder according to the first embodiment of the present invention is then to cool to solidify the active solder 3, so as to form an electrode pattern

31. After finishing the foregoing processes of printing, scraping and coating, the solar cell substrate 2 is cooled to solidify the active solder 3, so as to form an electrode pattern 31. The electrode pattern 31 can be an interdigitated arrangement or others arrangements. After being solidified, removing the screen 4, so that the electrode pattern 31 on the front side is finished. Moreover, in the process of forming the electrode pattern 31, it also can selectively connect a metal conductive wire to an upper side of the electrode pattern 31 for forming an n-type diffusion layer/active solder/metal conductive wire layer (not shown), in order to increase the electric connection property of the electrode pattern 31. The materials of the foregoing metal conductive wire layer can be made of Ag, Cu, Al, Au, Ag—Cu, Pt—Au or others alloys, but not limited thereto. The present invention also can use others metals, alloys and the mixture, as described above.

Furthermore, after forming the electrode pattern 31, selecting to form a protective layer (not shown) by electroless plating or electroplating for increasing the thickness of the electrode pattern 31. Metal of the electroless plating or electroplating is preferably Cu, Ni, Au, Ag, Sn or the composite layer thereof. The process of the foregoing electroless plating or electroplating can form a metal plated layer as the protective layer. The protective layer has an advantage to increase the connection property, the conductivity and the anti-rust effect of the electrode pattern 31 connected to external conductive wires. After the process of electroless plating or electroplating to increase the thickness, the final thickness of the electrode pattern 31 is preferably between 5 micrometer (μm) and 50 μm.

Figure 2E:
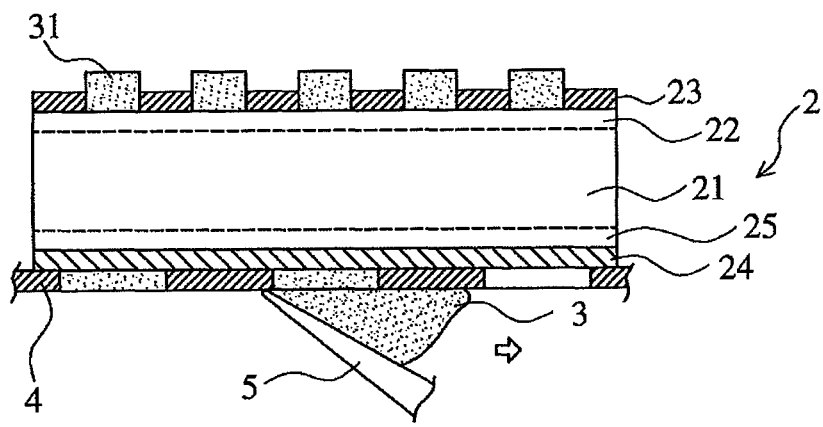

In the present embodiment, except for the steps in FIG. 2A to FIG. 2D, the present invention can further apply the conception of the foregoing processes to form another electrode pattern 32 on a back surface of the solar cell substrate 2, wherein the detailed processes are described, as follows:

Referring to FIG. 2E, the method for manufacturing electrodes of a solar cell formed by an active solder according to the first embodiment of the present invention is then to apply a screen 4 and a scraper 5 having a heating device for print-coating the molten active solder 3 on the back surface of the solar cell substrate 2. In the step, the screen 4 has a notch (not indicated), which has a shape corresponding to the predetermined shape of the electrode pattern 32 for filling the active solder 3 into the notch of the screen 4 by the scraper 5, in order to connect the active solder 3 onto the back surface of the solar cell substrate 2. If necessary, the back surface of the solar cell substrate 2 can preform the electrode pattern 32 and the reflection layer 24 on the back surface electrode by plasma enhanced chemical vapor deposition, physical vapor deposition, electroplating or screen-printing. The other effect of the back surface electrode is to reflect light into the solar cell, wherein the light is a portion of incident solar light that is incompletely absorbed and can be reflected back into the solar cell, for increasing a photo-currency. If the back surface of the solar cell substrate 2 is covered by aluminum (Al), the aluminum (Al) will diffuse into the solar cell substrate 2 by a heating process, so as to form a $p^+$ layer 25 having high concentration of aluminum (Al). The electrode pattern 32 is coated on the $p^+$ layer 25 of the back surface of the solar cell substrate 2. The active solder 3 forming the electrode pattern 31, 32 on the front and the back surfaces preferably has different components and/or component ratio to design that the electrode pattern 32 on the back surface has a lower melting temperature. Thus, it can avoid from affecting the structure of the electrode pattern 31 on the front surface during forming the electrode pattern 32 on the back surface.

Figure 2F:
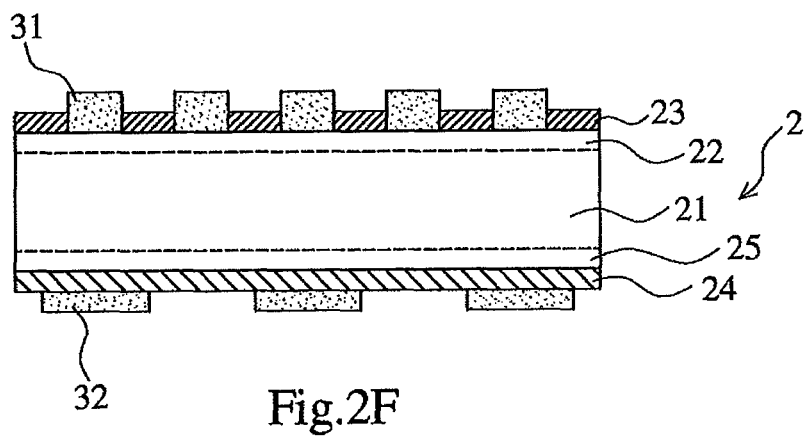

Referring to FIG. 2F again, the method for manufacturing electrodes of a solar cell formed by an active solder according to the first embodiment of the present invention is then to cool to solidify the active solder 3, so as to form a electrode pattern 32 on the back surface. The electrode pattern 32 can be arranged in interdigitated arrangement, longitudinal side-by-side arrangement, transverse side-by-side arrangement or other arrangements. After being solidified, removing the screen 4, so that the electrode pattern 32 on the back surface is finished. If necessary, after forming the electrode pattern 32, the electrode pattern 32 can be selectively formed with a protective layer (not shown) by electroless plating or electroplating for increasing the thickness of the electrode pattern 32. The final thickness of the electrode pattern 32 is 5-50 μm.

Figure 3:
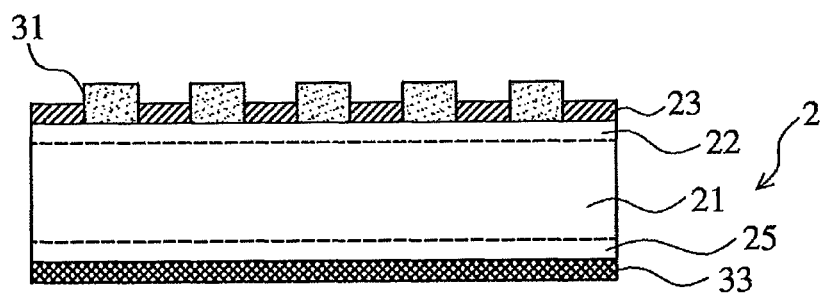
FIG. 3 is a schematic view of a method for manufacturing electrodes of a solar cell formed by an active solder according to a second embodiment of the present invention.

Referring to FIG. 3, a method for manufacturing electrodes of a solar cell formed by an active solder according to a second embodiment of the present invention is illustrated and similar to the first embodiment of the present invention, so that the same terms and numerals of elements are used as the first embodiment, wherein the manufacturing steps of the electrode pattern 31 on the front surface according to the second embodiment is the same as that of the first embodiment, as shown in FIG. 2A to FIG. 2D. However, after forming the electrode pattern 31 on the front surface, the second embodiment of the present invention further comprises steps of: applying a screen and a scraper with a heating device (not shown) for printing, scraping and coating the molten active solder 3 on the back surface of the solar cell substrate 2, so as to form a electrode pattern with anti-reflection layer 33 on the back surface. The electrode pattern with anti-reflection layer 33 on the back surface can reflect the light back into the solar cell, wherein the light is a portion of incident solar light that is incompletely absorbed and can be reflected back into the solar cell, for increasing a photo-currency. In the step, the methods of printing, scraping and coating of the screen and the scraper are the same as described above. The active solder 3 of the electrode pattern with anti-reflection layer 33 on the back surface preferably uses different components and/or component ratio for the active solder 3 containing IIIV group elements, such as to adding the elements of Al, B, In, TI or the mixture thereof. In the process of manufacturing the electrode pattern, the IIIV group elements are diffused to the solar cell substrate 2 for forming a $p^+$ layer 25 which contains high concentration of the IIIV group elements dopant.

Figure 4A:
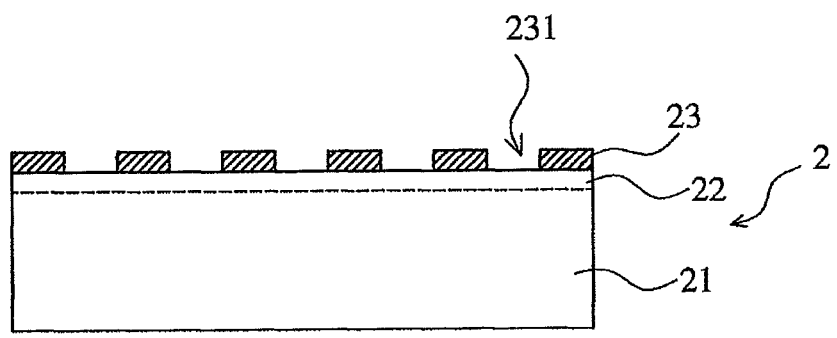
FIGS. 4A, 4B and 4C are partial schematic views of a method for manufacturing electrodes of a solar cell formed by an active solder according to a third embodiment of the present invention.
Figure 4B:
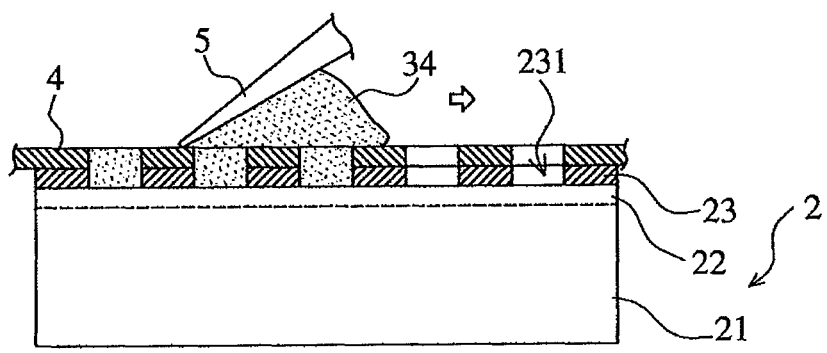
Figure 4C:
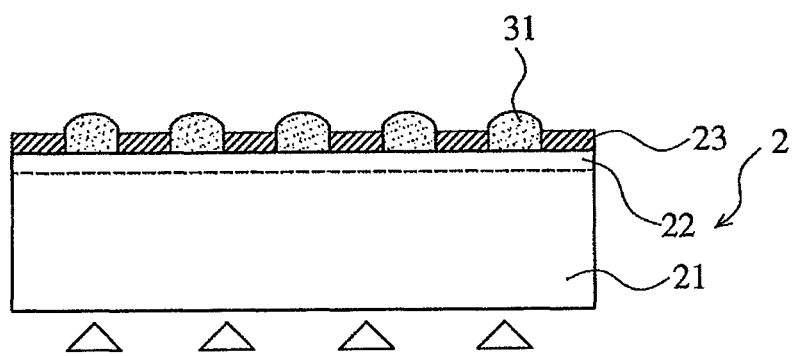

Referring to FIG. 4A. to FIG. 4C, a method for manufacturing electrodes of a solar cell formed by an active solder according to a third embodiment of the present invention is illustrated and similar to the first embodiment of the present invention, so that the same terms and numerals of elements are used as the first embodiment. However, the method for manufacturing electrodes of a solar cell formed by an active solder according to the third embodiment of the present invention comprises steps of: providing a solar cell substrate 2; providing an active solder paste 34 for being firstly applied on the solar cell substrate 2; then melting the active solder paste 34 at a temperature lower than 450° C.; and cooling to solidify the active solder paste 34, so as to form an electrode pattern 31. To compare to the first embodiment, the active solder 34 of the third embodiment is firstly applied and coated on the solar cell substrate 2, and then reflowed, so as to form an arched shape after being cooled to solidity. Furthermore, the present embodiment also can firstly apply the active solder paste 34 and then reflow the active solder paste 34 on the back surface of the solar cell substrate 2, so as to form another electrode pattern 32 (and/or a back surface electrode with anti-reflection layer 33), wherein the process of forming another electrode pattern 32 is similar to FIG. 2E, 2F and FIG. 3 and thus omitted hereinafter.

In the present embodiment, the active solder paste 34 contains 85-95 wt % of at least one type of active soldering power, the remaining is a flux. The at least one type of active soldering power has at least one type of soldering alloy which is mixed with 6 wt % or less of at least one type of active component and 0.01-2.0 wt % of at least one type of rare earth element (Re) The average particle diameter of the active solder paste 34 is about 0.2-20 μm, and preferably is 0.2-0.5 μm. Moreover, the flux is selected from commercially available pispersed rosin, active agent, organic solvent and thickener.

Figure 5:
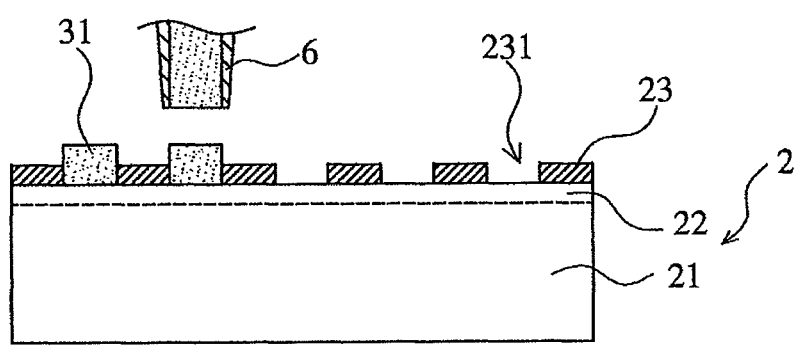
FIG. 5 is a diagram view of a blade coating step of a method for manufacturing electrodes of a solar cell formed by an active solder according to a forth embodiment of the present invention.

Referring to FIG. 5, a method for manufacturing electrodes of a solar cell formed by an active solder according to a forth embodiment of the present invention is illustrated and similar to the first embodiment of the present invention, and the same terms and numerals of elements are used as the first embodiment. However, the difference of the forth embodiment is that: in the method of firstly melting and then scraping or in the method of firstly scraping and then melting, a solder pin 6 can be selectively used to apply the active solder 3 into the notch 231 of the anti-reflection layer 23 on the front surface of the solar cell substrate 2 in a linear coating manner, so as to form the predetermined shape of the electrode pattern 31. Furthermore, the solder pin 6 also can be selectively used to apply the active solder 3 onto the back surface of the solar cell substrate 2 in a linear coating manner, so as to form the predetermined shape of the electrode pattern 32. The solder pin 6 can be accompanied with a heating device or an ultrasonicator for increasing the effect of active connection.

Figure 1:
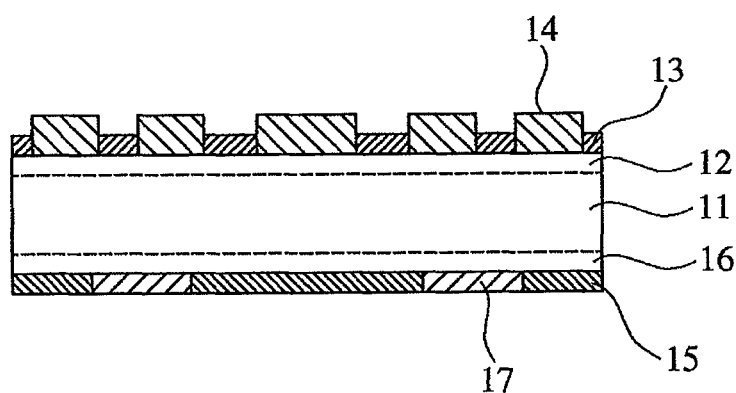
FIG. 1 is a cross-sectional view of a conventional solar cell element.

As described above, in the conventional solar cell element as shown in FIG. 1, the front surface electrode 14, the back surface electrode layer 15 and the conductive wire 17 made of silver (Ag), aluminum (Al) or silver-aluminum (Ag—Al) conductive pastes must pass through the high-temperature sintering of 450-850° C. and thus may be deteriorated or malfunctioned. Additionally, the foregoing conductive pastes contain non-conductive glass particles and the sintering flux of high-temperature sintering may contaminate the surface of solar chips, so that it needs additional cleaning. In contrast, as shown in FIG. 2A to FIG. 5 of the present invention, the active solder 3 of lower cost is used to form the front or the back surfaces of the electrode pattern 31, 32, wherein the active solder 3 only needs lower temperature for being soldered on the solar cell substrate 2 to form the electrode patterns 31,32. Therefore, it is advantageous to lower material cost, and simplify and enhance the process of manufacturing the electrodes.

Moreover, the present invention is to pre-form the notch 231 on the anti-reflection layer 23 of the solar cell substrate 2 for being filled with the active solder 3, so as to form the electrode pattern 31. Thus, it is unnecessary for the electrode pattern 32 to penetrate through the anti-reflection layer 23 by high-temperature sintering. Therefore, it is advantageous to ensure the reliability of electric connection between the electrode pattern 31 and the solar cell substrate 2 and increase the yield of manufacturing the electrode.

Furthermore, the electrode patterns 31,32 formed by the active solder 3 according to the present invention can further select to form a protective layer by electroless plating or electroplating for increasing the thickness of the electrode patterns 31,32 and increasing the connection property, the conductivity and the anti-rust effect of the electrode patterns 31,32 connected to external conductive wires.

The present invention has been described with a preferred embodiment thereof and it is understood that many changes and modifications to the described embodiment can be carried out without departing from the scope and the spirit of the invention that is intended to be limited only by the appended claims.

What is claimed is:

1. A method for manufacturing electrodes of a solar cell formed by an active solder, comprising steps of:
   providing a solar cell substrate;
   providing an active solder having a bismuth-based alloy mixed with 4 wt % or less of at least one type of active component which is selected from magnesium (Mg), lithium (Li) and the mixture thereof, and 0.01-2.0 wt % of at least one type of rare earth element;
   firstly melting the active solder at a temperature lower than 450° C.;
   then applying the molten active solder on the solar cell substrate; and
   cooling to solidify the active solder, so as to form an electrode pattern.

2. The method according to claim 1, wherein the step of applying the molten active solder on the solar cell substrate comprises using a screen to apply the molten active solder on the solar cell substrate, wherein the screen has a notch and the shape of the notch corresponds to the shape of the electrode pattern for melting the molten active solder on the solar cell substrate.

3. The method according to claim 1, wherein the rare earth element is selected from scandium (Sc), yttrium (Y) or a lanthanide element, and the lanthanide element is selected from lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb) or lutetium (Lu).

4. The method according to claim 1, wherein the solar cell substrate has a front surface and an anti-reflection layer formed on the front surface; and the anti-reflection layer is formed with a notch in which the active solder is filled, so as to form the electrode pattern.

5. The method according to claim 1, wherein the solar cell substrate having has a back surface, and the electrode pattern is formed on the back surface by the active solder.

* * * * *